United States Patent [19]

Chazelas et al.

[11] Patent Number: 5,629,699

[45] Date of Patent: May 13, 1997

[54] ANALOGUE-TO-DIGITAL CONVERTER AND ANALOGUE-TO-DIGITAL CONVERSION SYSTEM EMBODYING SAID CONVERTER

[75] Inventors: Jean Chazelas, Paris; Guy Le Parquier, Versailles; François Renault, Paris, all of France

[73] Assignee: Thomson-CSF, Paris, France

[21] Appl. No.: 499,957

[22] Filed: Jul. 10, 1995

[30] Foreign Application Priority Data

Jul. 29, 1994 [FR] France .................. 94 09436

[51] Int. Cl.[6] ........................................... H03M 1/00
[52] U.S. Cl. ............................ 341/137; 341/155
[58] Field of Search .......................... 341/137, 155, 341/133; 385/1

[56] References Cited

U.S. PATENT DOCUMENTS

| | | |
|---|---|---|
| 4,502,037 | 2/1985 | Le Parquier et al. |
| 4,694,276 | 9/1987 | Rastegar . |
| 4,928,007 | 5/1990 | Furstenau et al. ............ 341/137 |
| 4,947,170 | 8/1990 | Falk ............................ 341/137 |
| 5,010,346 | 4/1991 | Hamilton et al. ............. 341/137 |
| 5,381,147 | 1/1995 | Birkmayer ................... 341/137 |

FOREIGN PATENT DOCUMENTS 2691265 11/1993 France .

*Primary Examiner*—Jeffrey A. Gaffin
*Assistant Examiner*—Jason L. W. Kost
*Attorney, Agent, or Firm*—Oblon, Spivak, McClelland, Maier & Neustadt, P.C.

[57] ABSTRACT

An N-bit analogue-to-digital converter can increase the resolution by 3 bits, by very precise coding of the differential phase at the output of the electro-optic phase modulator controlled by the electric signal to be converted. The optical signals obtained are processed by an electro-optic device that outputs electric signals that are functions of the sine and cosine of the phase. A coding device uses the symmetry of the trigonometric circle partitioned into four consecutive sectors between 0 and $2\pi$ in order to convert the absolute values of the electric signals obtained on (N–3) bits, independently of the home sector of the phase. A transcoding device uses the value of the sine and cosine coded on (N–3) bits, to output a value V of the electric signal, on N bits, as a function of the home sector. The conversion system according to the invention comprises a first N-bit analogue-to-digital converter doing a very precise but ambiguous conversion of the electric signal, and a second analogue-to-digital converter to eliminate the ambiguity.

14 Claims, 5 Drawing Sheets

ANALOGUE-TO-DIGITAL CONVERTER AND ANALOGUE-TO-DIGITAL CONVERSION SYSTEM EMBODYING SAID CONVERTER

BACKGROUND OF THE INVENTION

This invention concerns a new analogue-to-digital converter architecture, and an analogue-to-digital conversion system embodying said converter.

Analogue-to-digital converters, hereinafter referred to as ADCs, are widely used in many engineering fields for digital processing of information input as analogue data, particularly in telecommunications and radar for which information throughputs are very high.

The two main performances required for the ADC function are:

high dynamics for the signal to be processed;

optimum processing speed that requires a high information input rate, furthermore knowing that to respect Nyquist's criterion, the clock frequency of the circuits used should be at least twice the highest frequency in the spectrum of the signal to be coded.

Difficulties encountered in the coding domain are related to the fact that it is not easy to obtain good dynamic and good wideband performances simultaneously.

The state of the art of ADCs includes firstly purely electronic converters (ramp ADC, ADC with successive approximations, flash ADC, etc.), which are either fast, or have good dynamics, and secondly electro-optic effect converters that can be very wideband (1 to 1.2 GHz) but which have a relatively poor dynamics (4 bits). The article entitled "Wide-band electro-optic guided-wave analogue-to-digital converters" IEEE, volume 72, No. 7, July 1984, describes a converter of this second type.

The latter type of converter uses a Mach-Zehnder interferometric modulator that consists of an opto-electric crystal coupled at the output with an optical divider that takes an optical input signal and outputs two components with exactly the same power on two optical channels of the same length, and an optical combiner at the output of these channels combines the signals output from them. The modulator also comprises two electrodes, one connected to the earth and the other receiving the analogue signal, for example a voltage, that is to be converted. An electric field E(t) is created as a result of applying the electric signal V(t). The Pockels effect translates the fact that the refraction index of the material used for the electro-optic crystal varies linearly with this electric field E(t). Before recombination, there is a differential phase $\phi(t)$ between the two optical signals at the output from the two optical channels, expressed by the following relation:

$$\phi(t) = \frac{2\pi L}{\lambda} kV(t)$$

where $\lambda$ is the wave length of the optical signal at the input to the interferometer;

L is the length of the optical channels, or the interaction length of the electro-optic line;

k is a constant;

V(t) is the analogue voltage to be coded.

ADCs with electro-optic effect described in the past and in the literature use several Mach-Zehnder interferometers in parallel and with an interaction length increasing as a power of 2, the signal V(t) to be converted being applied to each of the interferometers. Recombined signals at the output of each interferometer are then demodulated and compared with a common reference limit, in order to generate a binary value that depends on the result of the comparison. All binary values obtained then form the digitized value of the signal V(t).

Another known equivalent alternative is to use several interferometers with the same interaction length in parallel, the interferometers being powered by voltages proportional to the voltage to be converted, and decreasing as a power of ½.

However in both cases, the converters obtained have poor dynamics, since one interferometer is necessary for each resolution bit to be obtained.

SUMMARY OF THE INVENTION

The purpose of this invention is to propose a new ADC architecture capable of increasing the dynamics of existing analogue-to-digital converters, hereinafter referred to as elementary analogue-to-digital converters, by using electro-optic means like the Mach-Zehnder interferometer.

More precisely, the first objective of this invention is an analogue-to-digital converter outputting a value V of an electric signal coded on a number of bits N, wherein it comprises:

electro-optic means of phase modulation on a predetermined interaction length L, receiving an optical input signal and the electric signal to be converted, and outputting a first and second optical signal having with respect with each other a differential phase that varies linearly as a function of said electric signal to be converted;

an opto-electric device into which the first and second optical signals are input and that outputs at least a first and second electric signal, which are functions of the sine and cosine respectively of said differential phase;

coding means to extract absolute values of the first and second electric signals in digital form coded on [N−3] bits, said coding means having maximum coding dynamics adjusted to code absolute values with reference to a differential phase included in a home sector which will be one of the four possible consecutive sectors partitioning the trigonometric circle into 2Π radians;

transcoding means outputting said value V, by coding said differential phase on N bits, starting from absolute values coded on [N-3] bits and the given home sector.

According to the invention, it is also possible to use two analogue-to-digital converters as described above, to increase the resolution by an additional number of bits, n, giving a total of (N+n) bits, starting from elementary analogue-to-digital converters with (N−3) bits and two Mach-Zehnder type electro-optical modulators.

Another object of this invention is a conversion system on (N+n) bits including at least a first and second analogue-to-digital converter as defined above, wherein the first analogue-to-digital converter outputs a first value $V_1$ coded on N bits, and such that the electro-optic means generate a first differential phase ($\phi_1(t)$) capable of varying over $2^n \times (2\pi)$ radians for a maximum variation of the electric signal to be converted, and wherein the second converter, outputting a second value $V_2$ coded on N bits, has electro-optic means capable of generating a second differential phase ($\phi_2(t)$) capable of varying on $2\pi$ radians for said maximum variation of the electric signal to be converted, and wherein this system also comprises a device for combining the first and second values and outputting a third value $V_3$ encoded on (N+n) bits.

BRIEF DESCRIPTION OF THE DRAWINGS

The invention and its advantages will be better understood by reading the following description, which refers to the figures in the appendix:

FIG. 2b shows a block diagram representing an example embodying coding means and transcoding means placed at the output from the electro-optic device in FIG. 2a;

FIG. 3b shows a block diagram representing an example embodying coding and transcoding means placed at the output from the electro-optic device in FIG. 3a;

MORE DETAILED DESCRIPTION

The analogue-to-digital conversion principle used by the converter and the conversion system according to the invention depends on very precise coding of the differential phase $\phi(t)$ that exists between two optical signals obtained by modulating the phase of an input optical signal by the electric signal V(t) to be converted, over a given interaction length. The coding precision is obtained by generating the sine and cosine of the differential phase from the optical signals, and using symmetries of the trigonometric circle partitioned into $2\pi$ radians into four consecutive sectors to code the absolute value of the sine and cosine independently of the sector to which the phase actually belongs.

The differential phase is then coded starting from absolute coded values, in this case taking account of the sector to which the phase belongs.

Furthermore, by using symmetries of the trigonometric circle partitioned into four successive sectors according to the invention, we will show below that the analogue-to-digital converter according to the invention can give a value V of the electric signal V(t) coded on N bits, using existing converters only coding on (N−3) bits, which gives a total resolution gain of 3 bits.

Figure 1:
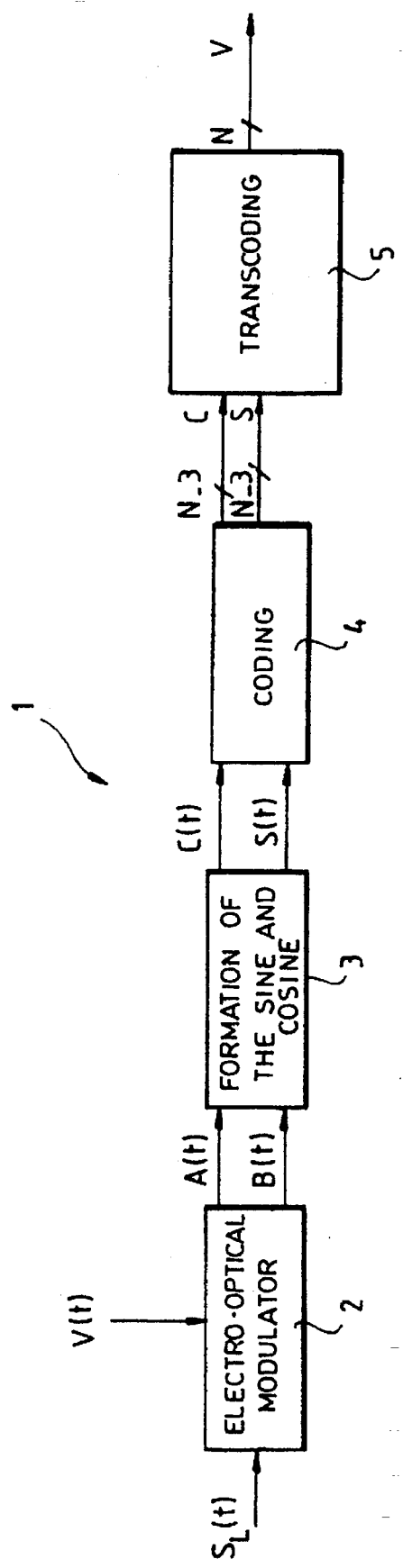
FIG. 1 represents a block diagram of an N-bit analogue-to-digital converter according to the invention.

FIG. 1 illustrates the means used to make analogue-to-digital converter 1 according to the invention, in the form of a simplified block diagram:

In accordance with FIG. 1, the analogue-to-digital converter 1 firstly comprises electro-optic means for making a phase modulation over a predetermined interaction L length, starting from an optical input signal $S_L(t)$ and the electrical signal V(t) that are to be converted on N bits. For example, these means form a Mach-Zehnder interferometer as described previously, except that the outputs from the two optical channels are not recombined.

If the optical signal $S_L(t)$ is expressed in the form:

$$S_L(t) = I_o \cos \omega_o t$$

where $I_o$ is the maximum signal intensity and $\omega_o$ is the signal pulse, electro-optical means 2 output a first optical signal A(t) and a second optical signal B(t) expressed in the following form:

$$\begin{cases} A(t) = \dfrac{I_o}{2} \cos(\omega_o t + \phi(t)) \\ B(t) = \dfrac{I_o}{2} \cos(\omega_o t) \end{cases}$$

where $\phi(t)$ represents the differential phase between the two optical signals A(t) and B(t).

In order to eliminate all ambiguity about the measurement of the differential phase $\phi(t)$ and therefore on the conversion of the analogue signal V(t), by preference we choose electro-optic means 2 with an optical channel length L such that the differential phase varies by $2\pi$ radians for a maximum variation of the signal to be converted.

Furthermore, the analogue-to-digital converter 1 comprises an electro-optic device 3 capable of using two input optical signals A(t), B(t), to generate at least a first electric signal S(t) that is a function of the sine of the differential phase, and a second electric signal C(t) that is a function of the cosine of the same phase.

Coding means 4 code absolute values of the signals S(t) and C(t) on (N−3) bits. Coding means have maximum coding dynamics adjusted to code absolute values S, C for a differential phase $\phi(t)$ belonging to a single sector among the four possible home sectors partitioning the trigonometric circle into $2\pi$ radians. Coding means 4 then output absolute values C and S of the cosine and sine coded on (N−3) bits using transcoding means 5 which in turn output the value V of the electric signal V(t), coded on N bits, as explained below.

Figure 2A:
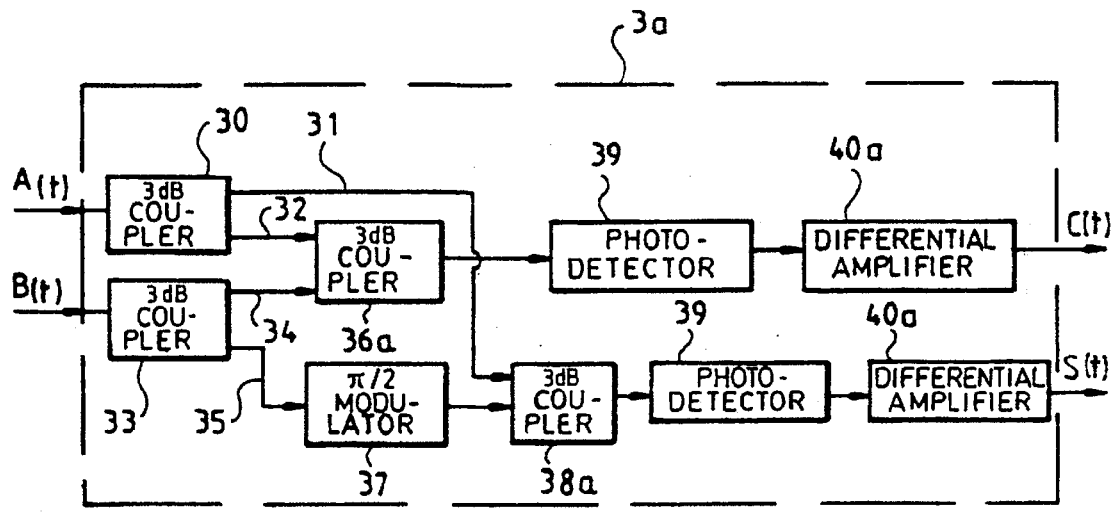
FIG. 2a shows a block diagram representing a first example embodying an electro-optic device used in the analogue-to-digital converter 1 in FIG. 1, for N equal to 11 bits.
Figure 2B:
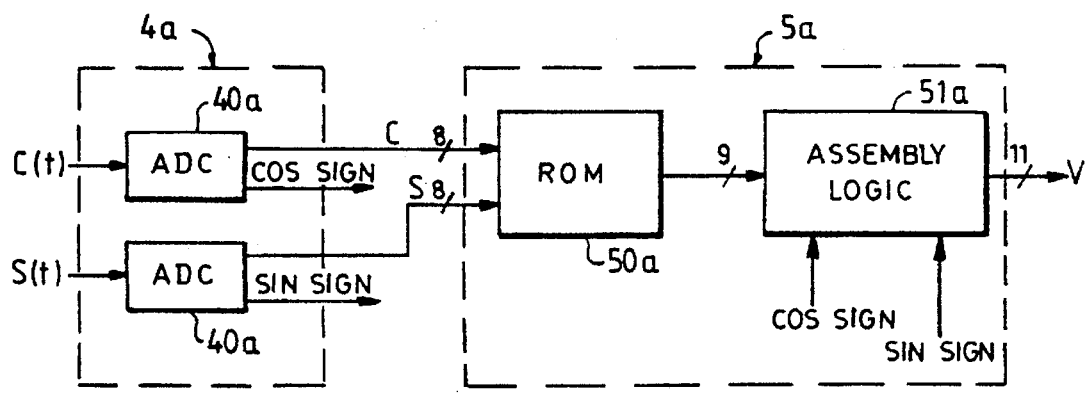

FIGS. 2a and 2b illustrate a first example of embodiment of the electro-optic device and coding and transcoding means in FIG. 1. This embodiment assumes that there are originally elementary analogue-to-digital converters coding the absolute value of signals at their input, and the sign of the input on one bit, on (N−3) bits. In order to facilitate the description, it is assumed below that available elementary ADCs have 8 bits plus 1 sign bit.

The first and second optical signal A(t), B(t) output from electro-optic means 2 are input into electro-optic device 3a in FIG. 2a (see FIG. 1), and the electro-optic device 2a outputs the first and second electric signals S(t) and C(t), dependent on the sine and cosine of the differential phase respectively, using the following optical or electro-optic elements:

The signals A(t) and B(t) are firstly divided into two optical signals with equal power by means of two 3 dB optical couplers 30 and 33 used as dividers. Using the same notation as before, the optical signals on divider 30 optical output channels 31 and 32 can be expressed in the form:

$$\frac{I_o}{4} \cos(\omega_o t + \phi(t))$$

Similarly, optical signals on divider 33 optical output channels 34 and 35 from are expressed in the following form:

$$\frac{I_o}{4} \cos \omega_o t$$

A first 3 dB optical coupler 36a used as combiner, then combines one of the divider coupler 33 outputs 34 with one of the divider 30 outputs 32, and outputs an optical signal in the following form:

$$\frac{I_o}{4} [\cos(\omega_o t + \phi(t)) + \cos \omega_o t]$$

The second optical output 35 from divider 33 is then input into an optical phase modulator making a phase shift of $\pi/2$ on the signal, and outputs an optical signal in the following form:

$$-\frac{I_o}{4} \sin \omega_o t$$

This latter signal is then combined with output 31 from the first divider 30 by means of a second 3 dB optical combiner 38a, so as to output an optical signal expressed in the following form:

$$\frac{I_o}{4} [\cos(\omega_o t - \phi(t)) - \sin \omega_o t]$$

The optical signals at the output from the two 3 dB combiners 36a and 38a are then transformed into electric signals, each passing through a photodetector performing a quadratic detection.

The calculation shows that electric signals from the photodetector connected to combiner 36a and the photodetector connected to combiner 38a, are in the following form, except for a constant factor:

$$\begin{cases} 1 + \cos \phi(t) \\ 1 + \sin \phi(t) \end{cases}$$

A differential amplifier 40a at the output from each photodetector 33 eliminates the DC component, using methods known to the expert in the field, in order to output the first electric signal S(t) and the second electric signal C(t), functions of the sine and cosine of the differential phase $\phi(t)$, respectively.

In accordance with FIG. 2b, coding means 4a, in the first non-restrictive example of an embodiment, receive as input the two electric signals C(t) and S(t) output from the electro-optic device 3a in FIG. 2b, and contain the following elements:

Two elementary ADCs 40a capable of encoding the signal receive the electric signals C(t) and S(t) as input, and output a value on 9 bits, in which 8 bits represent the absolute value C or S of the input, and one bit represents the sign. According to the invention, elementary ADCs 40a are adjusted in a known manner to output 256 possible absolute coded values for one input signal representative of a cosine or a sine between 0 and 1, for a differential phase in any one of the four home sectors of the trigonometric circle.

Transcoding means 5a include a double-addressing ROM 50a, the addresses being composed of absolute coded values C and S output from the two elementary ADCs 40a. This memory 50a includes pre-recorded values on 9 bits representative of the differential phase $\phi(t)$ corresponding to the various possible values of the sine and cosine on a sector. The real home sector of the differential phase is given by the two sine and cosine sign bits.

Assembly means 51a are then used to build up the coded value of the differential phase on 11 bits, the 9 low order bits being composed of the coded value read in the ROM 50a, and the high order bits being composed of the sine and cosine sign bits. As an example of the previous transcoding, a differential phase slightly less than $\pi$ radians will correspond to a value S equal to "00000000", a sine sign bit equal to "1", a value C equal to "11111111" and a cosine sign bit equal to "0". Consequently, the value output from the ROM will be "111111111" and the value output from the assembly will be "01111111111"

In the above description referring to FIGS. 2a and 2b, it was assumed that elementary ADCs were available capable of encoding the sign of the signal that they received in input, in other words either from the first electric signal S(t), or from the second electric signal C(t).

We will now describe an alternative of the analogue-to-digital converter, in which there are elementary ADCs that only encode the absolute values of signals S(t) and C(t), for example on eight bits:

In this alternative, the electro-optic device 3 in FIG. 1 outputs a third and fourth electric signal, in addition to the S(t) and C(t) signals, with the same absolute values of S(t) and C(t), but with opposite signs. In the following we will denote these supplementary signals as −S(t) and −C(t).

Figure 3A:
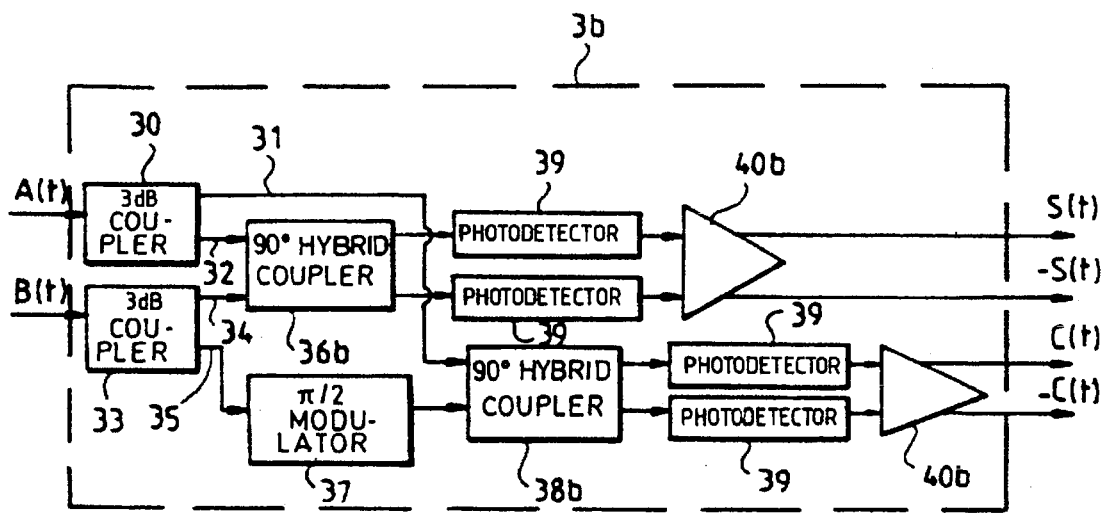
FIG. 3a shows a block diagram representing a preferred embodiment of the electro-optic device used in the analogue-to-digital converter in FIG. 1.

FIG. 3a is a simplified block diagram showing the components of an electro-optic device 3b which generates the four electric signals S(t), −S(t), C(t), −C(t), from the optical signals A(t) and B(t) output by optical means 2 (see FIG. 1):

In the optical part of device 3b, consisting of optical couplers and the optical modulator, elements identical to device 3a in FIG. 2a contain the same references and will not be described again.

However, the two 3 dB couplers 36a and 38a in FIG. 2a have been replaced here by two hybrid optical couplers at $\pi/2$ referenced 36b and 38b. The first combiner coupler 36b outputs two optical output signals that can be expressed by the following relations:

$$(1) \begin{cases} \frac{I_o}{4} [\cos(\omega_o t + \phi(t)) - \sin \omega_o t] \\ \frac{I_o}{4} [\cos(\omega_o t + \phi(t)) + \sin \omega_o t] \end{cases}$$

and the second hybrid combiner 38b also outputs two optical signals that can be expressed by the following relations:

$$(2) \begin{cases} \frac{I_o}{4} [\cos(\omega_o t + \phi) - \cos \omega_o t] \\ \frac{I_o}{4} [\cos(\omega_o t + \phi) + \cos \omega_o t] \end{cases}$$

The two optical signals in the system of relations (1) are input into a pair of photodetectors 39, the outputs from the photodetectors forming the two inputs to a differential amplifier 40b, the two outputs of which correspond to the first and third electric signal S(t) and −S(t).

Similarly, the series combination of a second pair of photodetectors 39 and a differential amplifier 40b output the second and fourth electric signal C(t) and −C(t) starting from the optical signals in the system of relations (2).

Figure 3B:
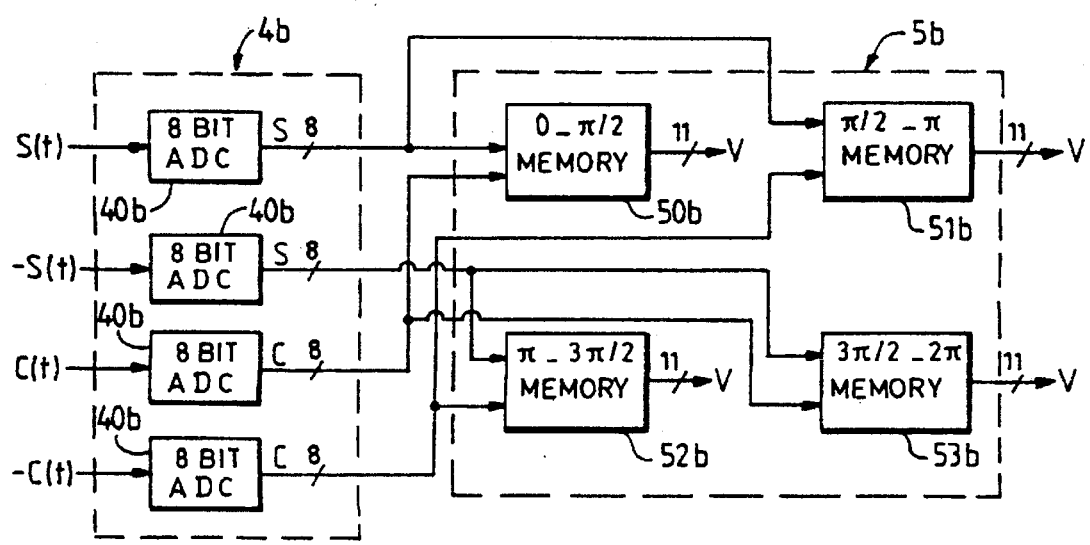

Coding means used at the output from the electro-optic device 3b in FIG. 3a are shown schematically on FIG. 3b:

They contain four elementary ADCs 40b capable of coding only the absolute value of the input signals, namely S(t), −S(t), C(t), −C(t). As before, the maximum coding dynamics of ADCs are adjusted so as to code the absolute values between 0 and 1 for a single home sector, for example on 8 bits.

Transcoding means 5b comprise four read only memories with double-addressing, each containing prerecorded values of the differential phase φ(t) coded on 11 bits, as a function of the home sector of this differential phase. In fact, the values contained in the different memories differ only by the two high order bits that indicate the home sector ("00" for φ(t) between 0 and π/2, "01" for φ (t) between π/2 and π, "10" for φ(t) between π and 3π/2, "11" for φ(t) between 3π/2 and 2π.

The various memories are addressed by values S and C originating from different elementary ADCs:

The first memory 50b for the angle sector between 0 and π/2 is addressed by the values S and C derived from coding the first and second signals S(t) and C(t), respectively.

The second memory 51b for the angle sector between π/2 and π is addressed by the values S and C derived from coding the first and fourth signals S(t) and −C(t), respectively.

The third memory 52b for the angle sector between π and 3π/2 is addressed by the values S and C derived from coding the third and fourth signals −S(t) and −C(t), respectively.

Finally, the last memory 53b for the angle sector between 3π/2 and 2π is addressed by the values S and C derived from coding the third and second signals −S(t) and C(t), respectively.

According to the above, the N-bit analogue-to-digital converter according to the invention can therefore increase the resolution of existing elementary ADCs by 3 bits, by using an electro-optic modulator, at least two elementary ADCs with (N−3) bits, a coding device and specific transcoding means.

It is useful to take some precautions in order to optimize operation of this type of converter:

The optical signal $S_L(t)$ at the input to electro-optic means 2 is preferably output by a laser source in the form of pulses, the duration of which are compatible with the electric signal V(t) transit time in the optical channels of means 2, for example of the order of 0.5 nanoseconds. The optical power of the laser source is chosen so as to provide an RMS voltage N−3 bits above the noise in the input signal V(t) passband, at the output from the photodetectors.

Furthermore, the input signal V(t) can be input into a sampler-blocker before being applied to electro-optical means 2, in order to stabilize the amplitude of the signal level V(t) during the interaction time with the laser signal $S_L(t)$. This sampler-blocker must work at the same rate as the analogue-to-digital converter and have the same dynamics, namely N bits.

Photodetectors used in the opto-electric device 3, 3a or 3b, must preferably have an instantaneous passband compatible with the passband of the signal to be processed.

Furthermore, it may be necessary to stabilize analogue elements and elementary ADCs:

This can be done by using the transcoding table to determine the amplitude ρ of the vector with components (S(t), C(t)), and to correct some non-linearities: if everything was perfect, this amplitude ρ should be constant regardless of the differential phase and the function ρ=f(φ) should be a circle. However, it is possible that the amplitude ρ is too large or too small, in which case the general converter gain has to be adjusted, for example by modifying the laser power. The function ρ=f(φ) can also be in the shape of an ellipse that has to be corrected by adjusting the relative gains of the amplifiers in order to obtain the various electrical signals that are functions of the sine and cosine. In summary, an analysis of the function describing the variation of ρ as a function of the differential phase can correct some defects by counter reaction.

Finally, it may be useful to reduce the interaction length L of opto-electric is means 2 used to do a phase modulation and to create out-of-phase signals. This can be done by using a Mach-Zehnder interferometer, in which the signal V(t) to be converted is input into the first electrode, and −V(t) is input into the second electrode instead of its being connected to the earth as previously.

Thus, we can show that the differential phase of two optical signals obtained at the output of electro-optic means 2 is equal to 2 φ(t). Therefore a symmetrical input to electrodes can divide the interaction length by 2.

In the following, we will describe a conversion system using two N-bit analogue-to-digital converters of the type described above in parallel, and capable of gaining an additional n bits of resolution, in other words converting the electric signal V(t) on N+n bits.

To do this, the conversion system according to the invention is such that one of the two analogue-to-digital converters used, called the fine converter, is adjusted so that the opto-electric means specific to it generate a differential phase φ1(t) in which the maximum variation, corresponding to a maximum variation of the input signal V(t) to be converted, is equal to $2^n \times (2\pi)$ radians, whereas the second converter, called the ambiguity elimination converter, is adjusted to generate a differential phase φ2(t) in which the maximum variation, corresponding to the same maximum variation of the input signal V(t) is equal to 2π radians.

There are two possible methods of embodying this system:

In the first case, if L is the interaction length to be given to the opto-electric phase modulation means in the fine converter to obtain maximum variation of the differential phase equal to $2^n \times (2\pi)$ radians, the value of the interaction length for the ambiguity elimination converter is fixed at $$\frac{L}{2^n}.$$

In this case, the same electric signal V(t) is input into the two converters simultaneously.

An alternative embodiment consists of using two converters that are identical in all respects, the electric signal V(t) being input into the fine converter, and an electric signal equal to $$\frac{V(t)}{2^n}$$

being input into the ambiguity elimination converter. This alternative is only possible if $$\frac{V(t)}{2^n}$$

is greater than the noise in the band to be processed.

In all cases, the same optical signal $S_L(t)$ will be input into the two converters used.

Each converter outputs a value coded on N bits, as described above. The final value $V_3$ digitizing the input signal V(t) includes (N+n) bits composed of N bits output by the fine converter for low order bits, and n high order bits corresponding to the low order bits output by the ambiguity elimination converter.

Figure 4A:
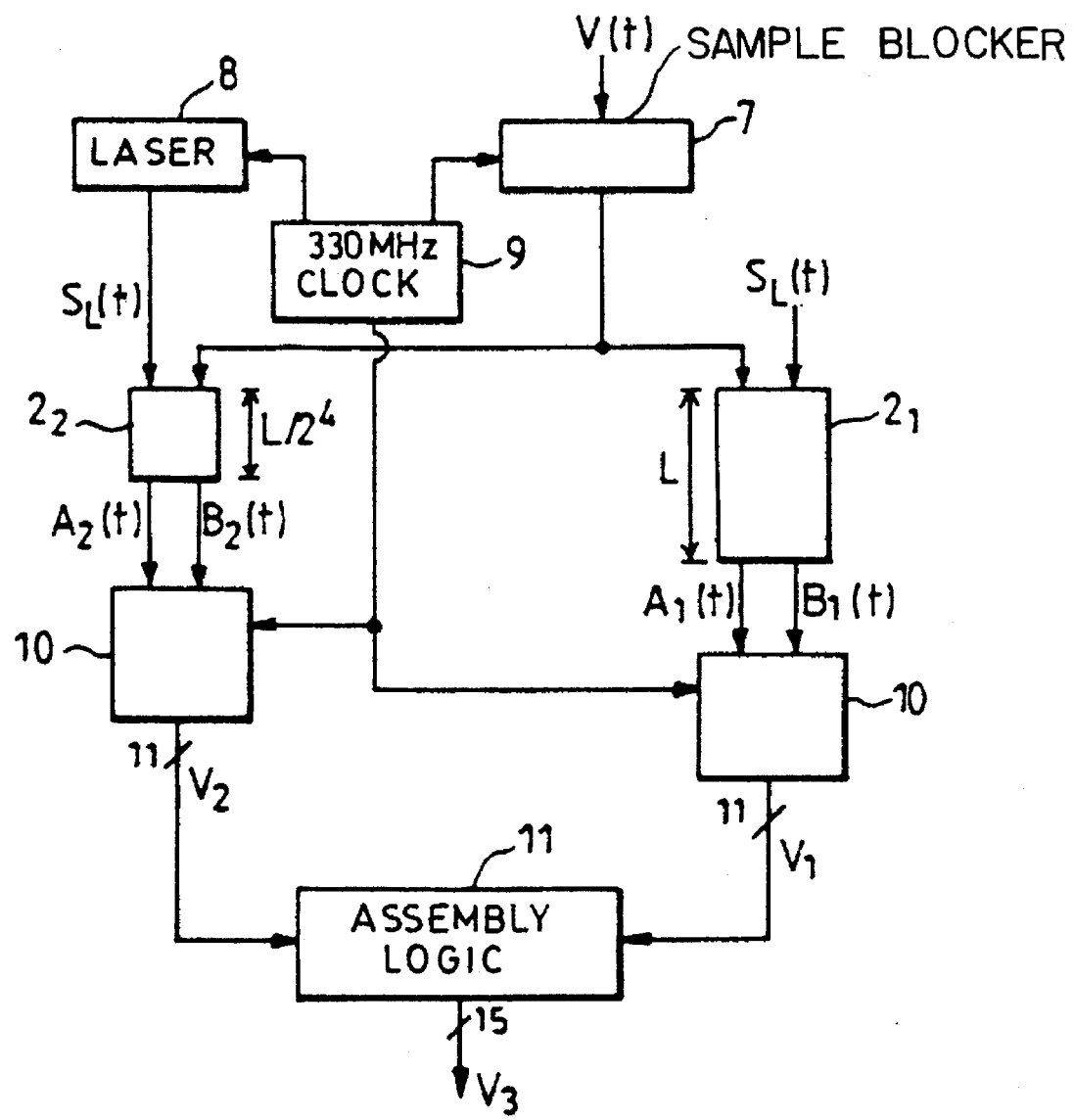
FIG. 4a schematically illustrates a first example embodying an (N+n) bit analogue-to-digital conversion system according to the invention.

FIG. 4a diagrammatically shows a first example of an embodiment in a 15-bit conversion system, in which interaction lengths for the first converter (fine converter) and the second converter (ambiguity elimination converter) are different.

On this figure, a laser module 8 outputs the input optical signal $S_L(t)$ simultaneously to opto-electric means 21 and 22 in the first and second converters respectively. The electric signal to be convened V(t) is also input into these converters, preferably after passing through a sampler-blocker 7. The electro-optic means 21 of the fine converter have an interaction length L determined such that the differential phase $\phi 1(t)$ between the two signals $A_1(t)$ and $B_1(t)$ at the output from these means, is subject to a variation of $2^5\pi$ radians for a maximum variation of signal V(t).

Furthermore, the electro-optical means $2_2$ in the ambiguity elimination converter have an interaction length fixed at $$\frac{L}{2^4},$$

such that the differential phase $\phi_2(t)$ between the two optical signals $A_2(t)$ and $B_2(t)$ output from these means is subject to a variation of $2\pi$ radians for the maximum variation of signal V(t). Signals $A_1(t)$ and $B_1(t)$ are processed in a block 10 containing the electro-optical device 3, coding means 4 and transcoding means 5 in FIG. 1, so as to output a first value $V_1$ and a second value $V_2$ coding the differential phase $\phi_1(t)$ and the differential phase $\phi_2(t)$ respectively on 11 bits. The first converter gives a very precise coding of the electric signal V(t), however leaving an ambiguity on the number of revolutions made by the differential phase $\phi_1(t)$. The second converter can eliminate this ambiguity. The values $V_1$ and $V_2$ are input into an assembly device 11 which outputs the value $V_3$ representative of the signal V(t) coded on 15 bits, the 11 low order bits being composed of the first value $V_1$ output from the fine converter, and the four high order bits being composed of the four low order bits of the second value $V_2$. Operation of the complete system is synchronized by the same clock 9, for example at a frequency of 330 MHz.

Figure 4B:
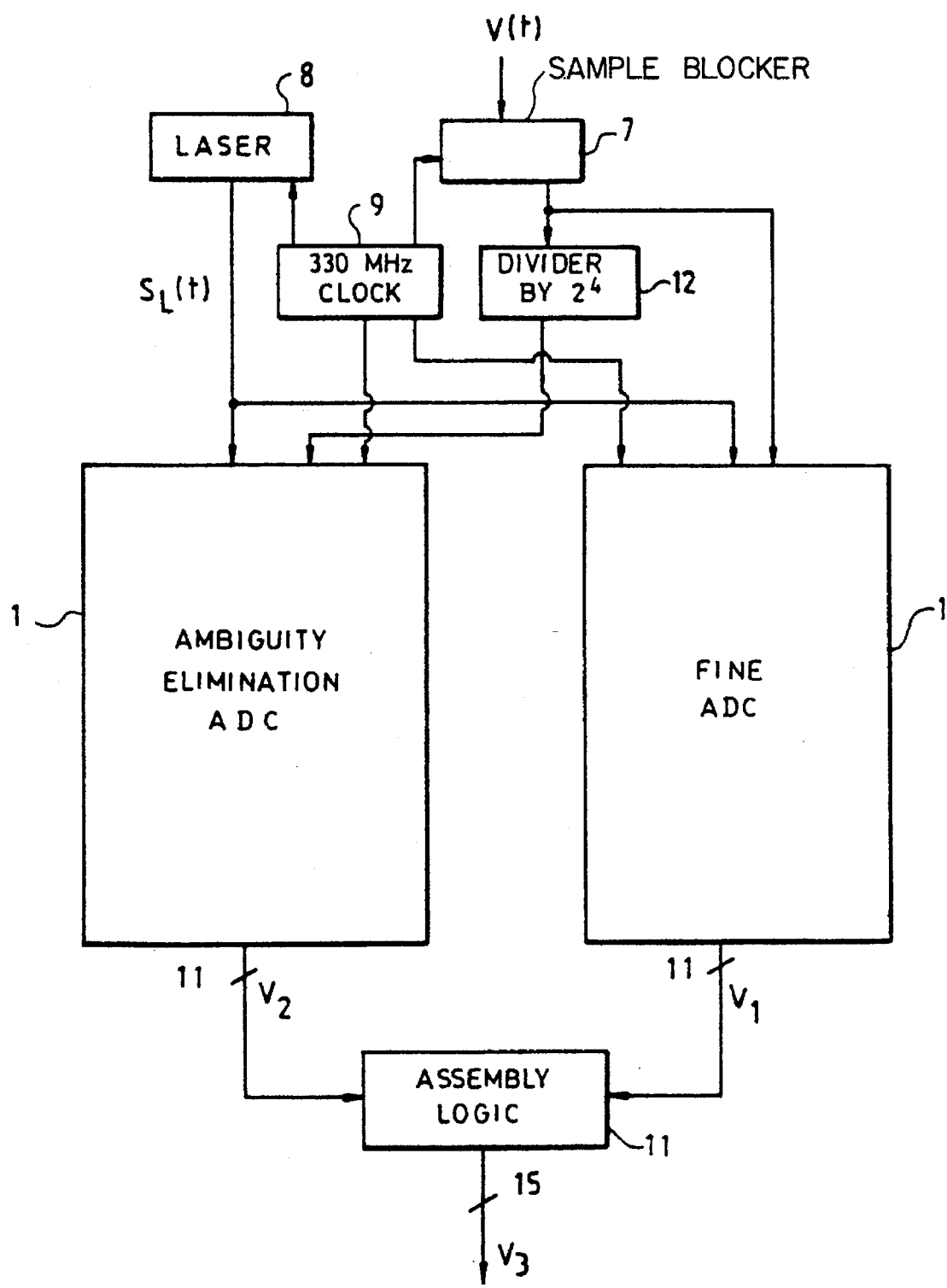
FIG. 4b schematically illustrates a second example embodying an (N+n) bit analogue-to-digital conversion system according to the invention.

FIG. 4b illustrates a second example of an embodiment in a conversion system with 15 bits according to the invention, in which the two converters 1 used are identical. After passing through the sampler-blocker 7, the electric signal V(t) is input into the fine converter, whereas a module 12 divides the signal V(t) by $2^4$ before applying the results of the division to the ambiguity elimination converter.

In the conversion system according to FIGS. 4a and 4b, the conversion takes place at clock rate 9, in other words at 330 MHz in the numeric examples chosen. The coding frequency can be increased by temporarily multiplexing several conversion systems according to the invention.

For example it is now possible to use the invention to make a 15-bit coding system operating at 2 Ghz using 6 multiplexed conversion systems including elementary 8-bit converters operating at 330 MHz.

What is claimed is:

1. Analogue-to-digital converter outputting a value V of an electric signal coded on a number of bits N, comprising:

electro-optic means of phase modulation on a predetermined interaction length L, receiving an optical input signal and the electric signal to be converted, and outputting a first and second optical signal having with respect with each other a differential phase that varies linearly function of said electric signal to be converted;

an opto-electric device into which the first and second optical signals are input and that outputs at least a first and second electric signal, which are functions of the sine and cosine respectively of said differential phase;

coding means to extract absolute values of the first and second electric signals in digital form coded on [N−3] bits, said coding means having maximum coding dynamics adjusted to code absolute values with reference to a differential phase included in a home sector which will be one of the four possible consecutive sectors partitioning the trigonometric circle into $2\pi$ radians;

transcoding means outputting said value V, by coding said differential phase on N bits, starting from absolute values coded on [N−3] bits and the given home sector.

2. Analogue-to-digital converter according to claim 1, wherein the electro-optic device also outputs third and fourth electric signals with absolute value equal to the first and second electric signals respectively, but with opposite signs.

3. Analogue-to-digital converter according to claim 2, wherein said electro-optic device comprises:

a first 3 dB optical divider coupler into which the first optical signal is input, and including a first and second optical output channel;

a second 3 dB optical divider coupler into which the second optical signal is input, and including a first and second optical output channel;

a π/2 phase modulator connected to the second optical output channel on the second divider coupler;

a first hybrid optical combiner coupler at π/2 connected to the first and the second optical output channels, on the second and first divider coupler, respectively, and generating two output signals;

a second hybrid optical combiner coupler π/2 connected to the first optical output channel from the first divider and the output from the π/2 phase modulator and generating output signals;

a first pair of photodetectors each receiving one or two output signals from the first π/2 hybrid optical coupler and outputting to a differential amplifier with two inputs and two outputs corresponding to the first and third electric signal a second pair of photodetectors each receiving one or two output signals from the second π/2 hybrid optical coupler and outputting to a differential amplifier with two inputs and two outputs corresponding to the second and fourth electric signal.

4. Analogue-to-digital converter according to any one of claims 2 or 3, wherein coding means comprise four elementary analogue-to-digital converters each receiving one of the four electric signals output from the electro-optic device and outputting an absolute value coded on [N−3] bits.

5. Analogue-to-digital converter according to claim 4, wherein transcoding means include four memories with double-addressing each containing pre-recorded values of the differential phase coded on N bits as a function of the home sector of said differential phase, namely:

a first memory for a phase differential between 0 and π/2, addressed by the outputs of the two elementary analogue-to-digital converters coding the first and second electric signals;

a second memory for a phase differential between π/2 and π, addressed by the outputs of the two elementary analogue-to-digital converters coding the first and fourth electric signals;

a third memory for a phase differential between π and 3π/2, addressed by the outputs of the two elementary analogue-to-digital converters coding the third and fourth electric signals;

a fourth memory for a phase differential between 3π/2 and 2π, addressed by the outputs of the two elementary analogue-to-digital converters coding the second and third electric signals.

6. Analogue-to-digital converter according to claim 1, wherein said electro-optic device comprises:

a first 3 dB optical divider coupler into which the first optical signal is input, and including a first and second optical output channel;

a second 3 dB optical divider coupler into which the second optical signal input, and including a first and second output channel;

a $\pi/2$ phase modulator connected to the second optical output channel on the second divider coupler, a first 3 dB optical combiner coupler connected to the first and the second optical output channels, on the second and first divider coupler, respectively;

a second 3 dB optical combiner coupler connected to the first optical output channel from the first divider and the output from the phase modulator at $\pi/2$;

two photodetectors connected to the outputs of the first and second 3 dB combiner couplers respectively;

two differential amplifiers at the output of the two photodetectors and outputting said first and second electric signals.

7. Analogue-to-digital converter according to claim 1 or 6, wherein coding means include two elementary analogue-to-digital converters into which the first and second electric signals are input, and outputting firstly the absolute coded values on [N–3] bits, and secondly the signs of the first and second electric signals, on 1 bit.

8. Analogue-to-digital converter according to claim 7, wherein the transcoding means comprise:

a double-addressing memory outputting a prerecorded coded value of the differential phase independently of the home sector, on [N–2] bits, using the two addresses composed of the said coded absolute values;

assembly means outputting the value V coded on N bits, the [N–2] low order bits being composed of the coded value output by the double-addressing memory, and the two high order bits being composed of the sign bits of the first and second electric signals output from the elementary analogue-to-digital converters.

9. Conversion system on (N+n) bits comprising at least a first and second analogue-to-digital converter as defined in claim 1, wherein the first analogue-to-digital converter, outputting a first value $V_1$ coded on N bits, is such that its electro-optic means generate a first differential phase capable of varying on over $2^n \times (2\pi)$ radians for a maximum variation of the electric signal to be converted, and wherein the second converter, outputting a second value $V_2$ coded on N bits, is such that its electro-optic means generate a second differential phase capable of varying on $2\pi$ radians for the said maximum variation of the electric signal to be converted, and wherein the system also comprises a device assembling the first and the second values and outputting a third value $V_3$ coded on N+n bits.

10. Conversion system according to claim 9, wherein since the interaction length for the first converter is equal to L, the interaction length for the second converter is fixed at $$\frac{L}{2^n}.$$

11. Analogue-to-digital converter according to claim 1, wherein the interaction length L is determined such that the differential phase varies by $2\pi$ radians for a maximum variation of the electric signal to be converted.

12. Conversion system according to any one of claims 11 to 9, wherein the assembly device outputs a third value $V_3$, in which the N low order bits are equal to the N bits of the first value $V_1$, and the N high order bits are equal to the n low order bits of the second value V2.

13. Analogue-to-digital converter according to claim 1, wherein the electro-optic means include a Mach-Zehnder interferometer comprising two electrodes, the first electrode being connected to the earth, and the electric signal to be converted being input into the second electrode.

14. Analogue-to-digital converter according to claim 1, wherein the electro-optic means comprise a Mach-Zehnder interferometer comprising two electrodes, the electric signal to be converted being input to one electrode, and the opposite of the electric signal to be converted being input into the second electrode.

* * * * *